(12) United States Patent
Lee et al.

(10) Patent No.: US 6,373,297 B1
(45) Date of Patent: Apr. 16, 2002

(54) INPUT BUFFER CAPABLE OF ACHIEVING QUICK RESPONSE

(75) Inventors: Jung Woo Lee, Kyunggi-do; Soon Won Hong, Seoul, both of (KR)

(73) Assignee: TLI, Inc., Kyunggi-do (KR)

( * ) Notice: Subject to any disclaimer, the term of this patent is extended or adjusted under 35 U.S.C. 154(b) by 0 days.

(21) Appl. No.: 09/756,213

(22) Filed: Jan. 9, 2001

(51) Int. Cl.[7] .................................................. H03B 1/00
(52) U.S. Cl. ........................................ 327/108; 327/390
(58) Field of Search ................................. 327/108, 109, 327/110, 111, 112, 390, 589, 543; 326/83, 85, 87; 330/263, 264, 267; 323/315

(56) References Cited

U.S. PATENT DOCUMENTS

| | | | | |
|---|---|---|---|---|
| 4,816,773 A | * | 3/1989 | Pricer | 330/267 |
| 5,537,067 A | * | 7/1996 | Carvajal et al. | 327/108 |
| 5,973,512 A | * | 10/1999 | Baker | 326/87 |
| 6,154,069 A | * | 11/2000 | Ebihara | 327/112 |

* cited by examiner

Primary Examiner—Terry D. Cunningham
Assistant Examiner—Paul Dinh
(74) Attorney, Agent, or Firm—Rabin & Berdo, P.C.

(57) ABSTRACT

An input buffer capable of achieving quick response. The input buffer includes first and second direct-current (DC) voltage controllers and first and second drivers. The first and second DC voltage controllers generate first and second alternating current (AC) signals having AC voltage components of the buffer input signal reflected thereon, respectively. The first driver drives the voltage level of a buffer output signal to the level of a first voltage, that is, a power supply voltage, in response to the first AC signal. The second driver drives the voltage level of a buffer output signal to the level of a second voltage, that is, a ground voltage, in response to the second AC signal. The first and second AC signals respond to a buffer input signal quickly. The first and the second drivers drive the levels of the buffer output signal to the power supply voltage level and the ground voltage level quickly and by a large amount. Therefore, the input buffer can generate a buffer output signal having a large amplification factor and a quick response characteristic even if a buffer input signal having small amplitude is input.

12 Claims, 5 Drawing Sheets

INPUT BUFFER CAPABLE OF ACHIEVING QUICK RESPONSE

BACKGROUND OF THE INVENTION

1. Field of the Invention

The invention relates to an electronic circuit, and more particularly, to an input buffer for amplifying the voltage swing range of an in put signal.

2. Description of the Related Art

An input buffer is an interface circuit for converting an externally provided input signal into an internal signal suitable for operation in an internal circuitry. For example, if an external signal input to a memory device is a transistor-transistor logic (TTL) level signal, an interface circuit is required for converting the external signal into a complementary metal oxide semiconductor (CMOS) level signal. One such interface circuit is an input buffer.

FIG. 1 is a circuit diagram of a conventional input buffer. Referring to FIG. 1, the conventional input buffer is a differential-amplifier-type circuit, including first and second PMOS transistors P12 and P14 and first and second NMOS transistors N12 and N14.

A buffer input signal IN is applied to a gate terminal of the first NMOS transistor N12 and a reference voltage VREF is applied to a gate terminal of the second NMOS transistor N14. The buffer input signal IN is then compared with the reference voltage VREF. If the voltage level of the buffer input signal IN is higher than that of the reference voltage VREF, more current flows through the first NMOS transistor N12 than through the second NMOS transistor N14. Thus, the voltage level of a buffer output signal OUT goes up to that of a power supply voltage (VDD). If the voltage level of the buffer input signal IN is lower than that of the reference voltage VREF, more current flows through the second NMOS transistor N14 than through the first NMOS transistor N12. Thus, the voltage level of the buffer output signal OUT goes down to the ground voltage (GND).

However, in the conventional input buffer, the buffer input signal IN is compared with the reference voltage VREF to then generate the buffer output signal OUT. Thus, the buffer output signal OUT fully swings, centered on the reference voltage VREF. In other words, in the conventional input buffer, the center of the voltage of the buffer output signal OUT may also change depending on a variation of the reference voltage VREF. Thus, there is a need for an additional reference voltage generation circuit for providing a stabilized reference voltage VREF. Also, the conventional input buffer is of a differential amplifier type. Therefore, it is difficult to achieve a high amplification factor and a high-speed operation due to a limitation in the amplifying capability.

SUMMARY OF THE INVENTION

To solve the above problems, it is an object of the invention to provide an input buffer operating at high speed and having a large amplification factor and a stabilized mid-level voltage swing.

In an embodiment of the invention, an input buffer amplifies a buffer input signal and generates a buffer output signal. Preferably, the input buffer includes first and second direct-current (DC) voltage controllers, and first and second drivers. The first and the second direct-current (DC) voltage controllers generate first and second alternate-current (AC) signals having AC voltage components of the buffer input signal reflected thereon, respectively. And the first driver provides the buffer output signal, the voltage of which is driven to a first level in response to a first AC signal. The second driver provides the buffer output signal, the voltage of which is driven to a second level in response to the first AC signal. According to the input buffer of the invention, it is possible to obtain a buffer output signal having an increased operation speed, an improved amplification factor and a stabilized mid-level voltage swing.

BRIEF DESCRIPTION OF THE DRAWINGS

The foregoing, and further objects, features, and advantages of this invention will become more apparent from a consideration of the following description, the appended claims, and the accompanying drawings in which the same numerals indicate the same or corresponding parts:

DESCRIPTION OF THE PREFERRED EMBODIMENTS

Figure 1:
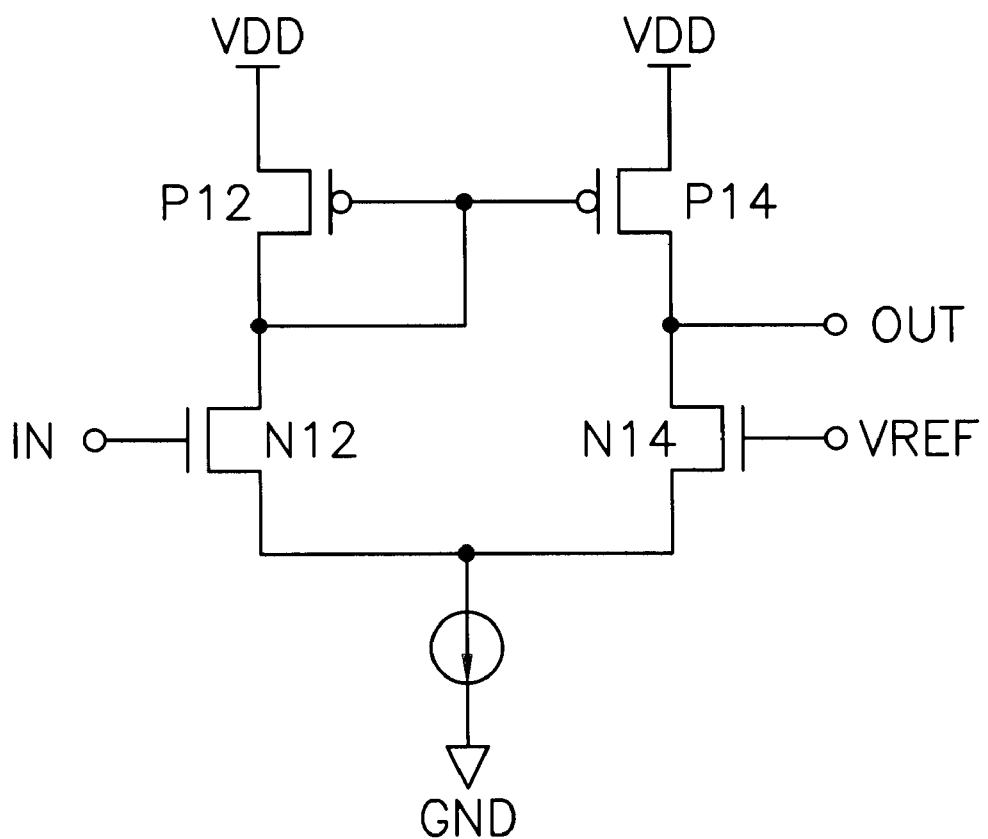
FIG. 1 is a circuit diagram illustrating a conventional input buffer.
Figure 2:
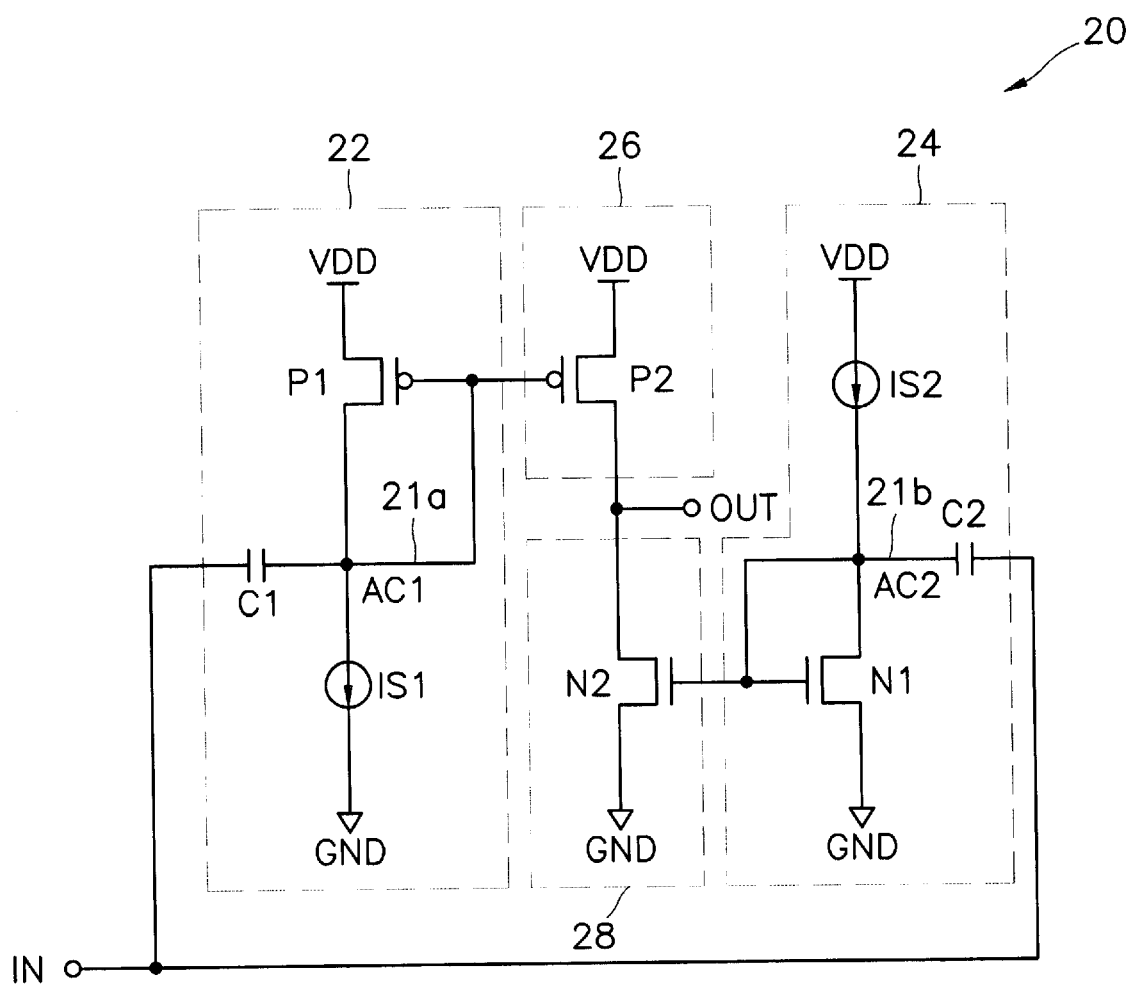
FIG. 2 is a circuit diagram illustrating an input buffer according to an embodiment of the invention.

FIG. 2 is a circuit diagram illustrating an input buffer according to a preferred embodiment of the invention. Referring to FIG. 2, an input buffer 20 according to a preferred embodiment of the invention includes first and second direct-current (DC) voltage controllers 22 and 24 and first and second drivers 26 and 28. The first and the second DC voltage controllers 22 and 24 generate first and second AC signals AC1 and AC2, respectively. Alternate-current (AC) voltage components of a buffer input signal IN are reflected on the first and the second AC signals AC1 and AC2. The first driver 26 is implemented with a PMOS transistor P2. To the gate terminal of the PMOS transistor P2, the first AC signal AC1 is applied. The source terminal of the PMOS transistor P2 is connected to a power supply voltage (VDD), and the drain terminal of the PMOS transistor P2 is connected to a buffer output signal OUT. The first driver 26 drives the voltage of the buffer output signal OUT to the level of the power supply voltage VDD, i.e., a first voltage, in response to the first AC signal AC1. An NMOS transistor N2 implements the second driver 28. To the gate terminal of the NMOS transistor N2, the second AC signal AC2 is applied. The source terminal of the NMOS transistor N2 is connected to a ground voltage (GND), the drain terminal of the NMOS transistor N2 is connected to the buffer output signal OUT. The second driver 28 drives the voltage of the buffer output signal OUT to the level of the ground voltage GND, i.e., a second voltage, in response to the second AC signal AC2.

Preferably, the first DC voltage controller 22 includes a first capacitor C1, a first control transistor P1 and a first current source IS1. The first capacitor C1 is formed between the buffer input signal IN and the first AC signal AC1. The first control transistor P1 is formed between the first AC signal AC1 and the power supply voltage VDD. And the first current source IS1 formed between the first AC signal AC1 and the ground voltage GND.

Likewise, the second DC voltage controller 24 preferably includes a second capacitor C2, a second control transistor N1 and a second current source IS2. The second capacitor C2 is formed between the buffer input signal IN and the second AC signal AC2. The second control transistor N1 is formed between the second AC signal AC2 and the ground voltage GND. And the second current source IS2 is formed between the second AC signal AC2 and the power voltage VDD.

The constitution of the first DC voltage controller 22 will now be described in more detail. Preferably, the first control transistor P1 is a PMOS transistor. The source terminal of the first control transistor P1 is connected to the power supply voltage VDD and the gate terminal and drain terminal thereof are commonly connected to a first node 21a. Also, one-end terminal of the first current source IS1 and one-end terminal of the first capacitor C1 are also commonly connected to the first node 21a. The first control transistor P1 and the first current source IS1 are controlled such that the DC voltage of the first node 21a, that is, the DC voltage of the first AC signal AC1, is maintained at a constant level. If the input buffer signal IN is not applied, the DC voltage $V_{D1}$ of the first node 21a is represented by the following Equation 1:

$$V_{D1} = V_{DD} - |V_{TP}| - \sqrt{\frac{2L_{P1}I_{S1}}{K_P W_{P1}}} \quad (1)$$

wherein $V_{D1}$, denotes the DC voltage of the first node 21a, $V_{DD}$ denotes the power supply voltage, |TP| denotes the absolute value of the threshold voltage of the first control transistor P1, $L_{p1}$ and $W_{p1}$ denote respectively the channel length and width of the first control transistor P1, $I_{s1}$, denotes the current value of the first current source IS1, and $K_p$ denotes the processing parameter.

As shown in Equation 1, the DC voltage $V_{D1}$ of the first node 21a is determined by the first control transistor P1 and the first current source IS1. Preferably, the DC voltage $V_{D1}$ of the first node 21a is set to be close to $V_{DD}-|V_{TP}|$.

If the input buffer signal IN is input, a variation in the buffer input signal IN is reflected on the voltage of the first node 21a, that is, the first AC signal AC1 through the first capacitor C1. However the DC voltage $V_{D1}$ of the first node 21a is recovered by the control operation of the first control transistor P1 and the first current source IS1. Therefore, the DC component of the input buffer signal IN is cut off. And the first AC signal AC1 is generated, on which only the AC component is reflected.

Next, the constitution of the second DC voltage controller 24 will be described. The second DC voltage controller 24 includes a second control transistor N1, a second current source IS2 and a second capacitor C2. The second control transistor N1 is preferably an NMOS transistor. The source terminal of the second control transistor N1 is connected to the ground voltage GND, and the gate terminal and drain terminal thereof are commonly connected to a second node 21b. Also, one-end terminal of the second current source IS2 and one-end terminal of the second capacitor C2 are also commonly connected to the second node 21b. The second control capacitor N1 and the second current source IS2 are controlled such that the DC voltage of the second node 21b, that is, the DC voltage of the second AC signal AC2, is maintained at a constant level. If the input buffer signal IN is not applied, the DC voltage $V_{D2}$ of the second node 21b is represented by the following Equation 2:

$$V_{D2}=V_{TN}+((2L_{N1}I_{S2})/(K_N W_{N1}))^{1/2} \quad (2)$$

wherein $V_{D2}$ denotes the DC voltage of the second node 21b, $V_{TN}$ denotes the threshold voltage of the second control transistor IN, $L_{N1}$ and $W_{N1}$ denote the channel length and width of the second control transistor N1, $I_{S2}$ denotes the current value of the second current source IS2, and $K_N$ denotes the processing parameter, respectively.

As shown in Equation 2, the DC voltage $V_{D2}$ of the second node 21b is determined by the second control transistor N1 and the second current source IS2. Preferably, the DC voltage $V_{D2}$ of the second node 21b is set to be close to $V_{TN}$.

If the input buffer signal IN is input, a variation in the buffer input signal IN is reflected on the voltage of the second node 21b, that is, the second AC signal AC2 through the second capacitor C2, like in the first DC voltage controller 22. However, the DC voltage $V_{D2}$ of the second node 21b is recovered by the control operation of the second control transistor N1 and the second current source IS2. Therefore, the DC component of the input buffer signal IN is cut off. And the second AC signal AC2 is generated, on which only the AC component is reflected. Preferably, the first driver 26 includes the first driving transistor P2, which is a PMOS transistor, and the second driver 28 includes the second driving transistor N2, which is an NMOS transistor. The gate terminal of the first driving transistor P2 is connected to the first node 21a, the source terminal thereof is connected to the power supply voltage VDD, and the drain terminal thereof is connected to the buffer output signal OUT. The first AC signal AC1 is applied to the gate terminal of the first driving transistor P2. The gate terminal of the second driving transistor N2 is connected to the second node 21b, the source terminal thereof is connected to the ground voltage GND, and the drain terminal thereof is connected to the buffer output signal OUT. The second AC signal AC2 is applied to the gate terminal of the NMOS transistor N2 of the second driver 28.

Figure 3:
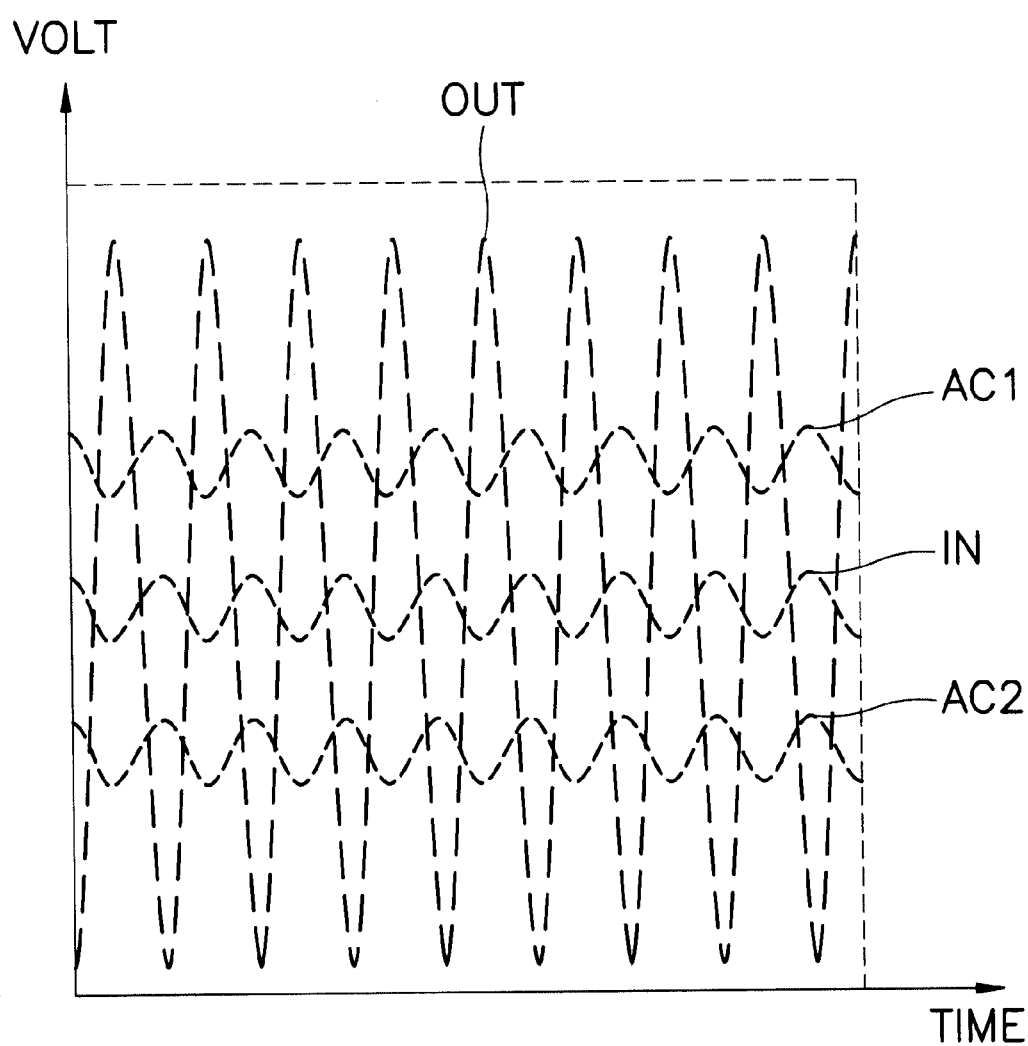
FIG. 3 is a waveform diagram illustrating principle signals shown in FIG. 2.

FIG. 3 is a waveform diagram of major signals shown in FIG. 2. Referring to FIG. 3, the overall operation of the input buffer 20 according to an embodiment of the invention will now be described. First, the case where the voltage level of the buffer input signal IN falls will be described. If the voltage level of the buffer input signal IN falls, the voltage levels of the first and the second AC signals AC1 and AC2 instantaneously fall quickly in response thereto. Then, the conductance of the first driving transistor P2 is quickly increased and the conductance of the second driving transistor N2 is quickly reduced. Thus, the buffer output signal OUT is driven quickly by a large amount to the level of the power supply voltage VDD.

The operation and the effect of the input buffer 20 in the case where the voltage level of the buffer input signal IN rises are substantially similar to those in the case where the voltage level of the buffer input signal IN falls. In other words, if the voltage level of the buffer input signal IN rises, the voltage levels of the first and the second AC signals AC1 and AC2 instantaneously rise quickly in response thereto. Then, the conductance of the first driving transistor P2 is quickly reduced and the conductance of the second driving transistor N2 is quickly increased. Thus, the buffer output signal OUT is driven quickly by a large amount to the level of the ground voltage GND.

Therefore, according to the input buffer of the invention, even if a buffer input signal has a small amplitude, the buffer output signal has a large amplification factor and a quick response characteristic.

Figure 4:
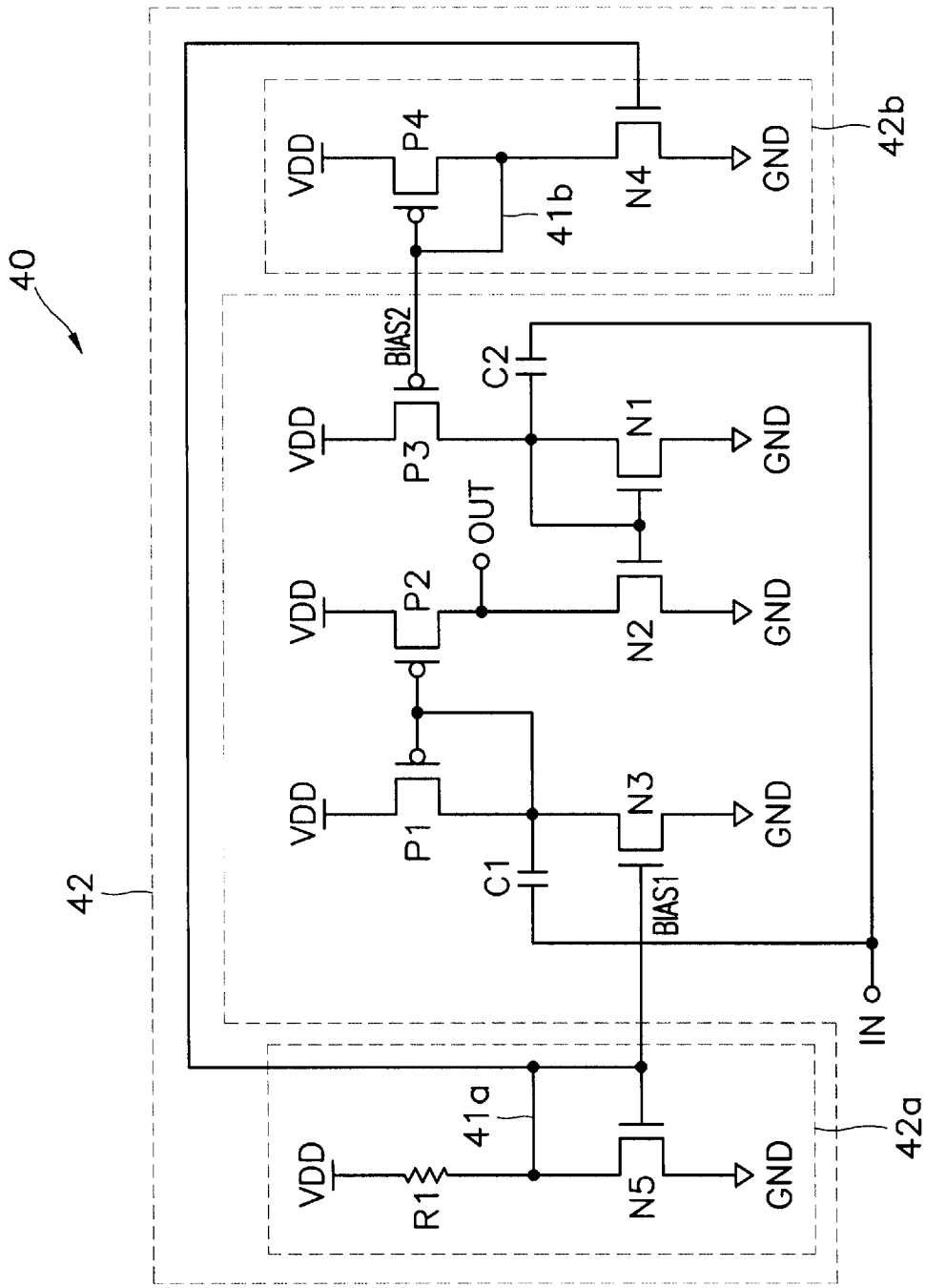
FIG. 4 is a circuit diagram of an input buffer according to another embodiment of the invention.

FIG. 4 is a circuit diagram of an input buffer according to another embodiment of the invention, showing an example of implementing the current source shown in FIG. 2 by a MOS transistor controlled by a bias signal. Referring to FIG. 4, first and second current sources N3 and P3 are MOS transistors controlled by first and second bias signals, respectively. An input buffer 40 according to another embodiment of the invention further includes a bias unit 42 for generating first and second bias signals BIAS1 and BIAS2. Except the bias unit 42 and the first and the second current sources N3 and P3, the other elements are the same as those in FIG. 2, and a detailed explanation thereof will not be provided.

The bias unit 42 is constructed in the form of a current mirror by a first bias part 42a having a resistance R1 and an NMOS transistor N5, and a second bias part 42b having an NMOS transistor N4 and a PMOS transistor P4.

The elements of the first bias part 42a will now be described in detail. The resistance R1 is formed between the power supply voltage VDD and the first bias signal BIAS1. The NMOS transistor N5 has a gate terminal and a drain terminal commonly connected to the first bias signal BIAS1 and a source terminal connected to the ground voltage GND.

Therefore, the current flow in the first bias part 42a is determined according to the power supply voltage VDD, the resistance R1 and the NMOS transistor N5. Accordingly, the voltage level of the third node 41a is determined. Thus, the first bias part 42a functions as a voltage source providing the first bias signal BIASI of a constant voltage. The first bias signal BIAS1 is applied to the gate terminal of the NMOS transistor N4. If the NMOS transistor N5 and the NMOS transistor N4 are the same, the current flowing in the second bias part 42b is the same as that flowing in the first bias part 42a. The first bias signal BIAS1 is also applied to the gate terminal of a first current source N3 that can be implemented by an NMOS transistor. Here, the channel width to length (W/L) ratio of the first current source N3 is adjusted to a multiple of the channel width to length (W/L) ratio of the NMOS transistor N5, thereby controlling the amount of the current flowing through the first current source N3.

Next, the elements of the second bias part 42b will be described in detail. The NMOS transistor N4 has a gate terminal gated by the first bias signal BIAS1, a source terminal connected to the ground voltage GND and a drain terminal connected to the second bias signal BIAS2. The PMOS transistor P4 has a gate terminal and a drain terminal commonly connected to the second bias signal BIAS2 and a source terminal connected to the power supply voltage VDD. Consequently, the gate terminal and drain terminal of the PMOS transistor P4 of the second bias part 42b and the gate terminal of the second current source P3 are commonly connected to a fourth node 41b. If the current flowing in the second bias part 42b is the same as the current flowing in the first bias part 42a, the fourth node 41b has a predetermined voltage level. Thus, like the first bias part 42a, the second bias part 42b functions as a voltage source that provides the second bias signal BIAS2 of a constant voltage. Thus, the channel width to length (W/L) ratio of the second current source P3 is adjusted to a multiple of the channel width to length (W/L) ratio of the PMOS transistor P4, thereby controlling the amount of the current flowing through the second current source P3.

Also, the W/L ratios of the first and the second driving transistors P2 and N2 are adjusted to a multiple of the ratios of the channel widths of the first and the second control transistors P1 and N1 to the lengths. Therefore, the amount of the current flow in the first and the second driving transistors P2 and N2 can be controlled. In order to obtain a buffer output signal OUT that fully swings between the power supply voltage VDD and the ground voltage GND, centered on the mean value of the power supply voltage VDD and the ground voltage GND, it is preferable to make the same amount of current flow in the first and the second driving transistors P2 and N2.

Figure 5:
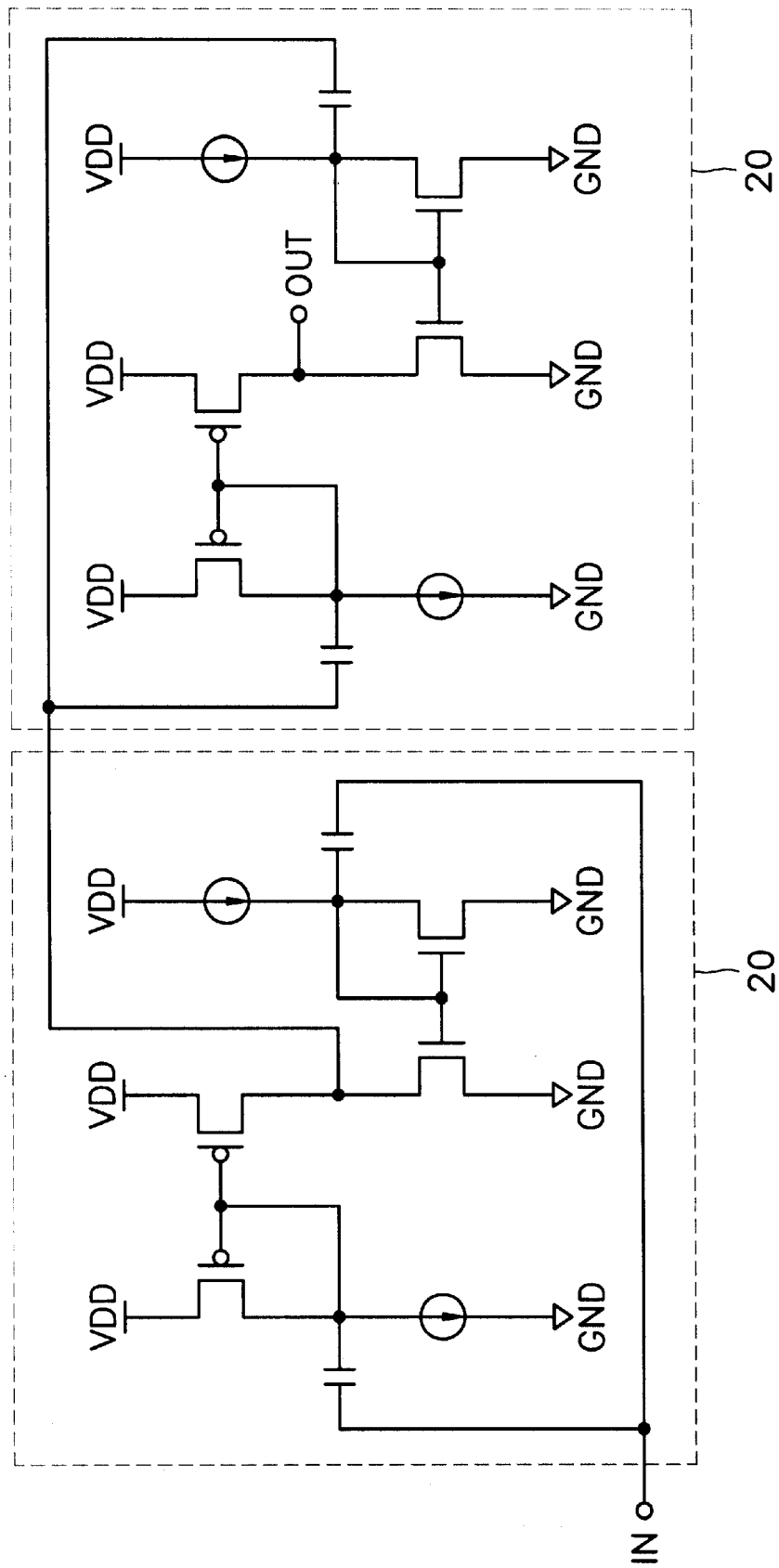
FIG. 5 is a diagram illustrating an example of applications implemented by connecting a plurality of input buffers according to the invention.

FIG. 5 is a diagram illustrating an example of applications implemented by connecting a plurality of input buffers according to an embodiment of the invention. As in the embodiment shown in FIG. 5, although the characteristic of a buffer output signal output from an input buffer may not be perfect, a buffer output signal OUT having improved characteristics can be obtained by making the signal pass through another consecutively serial-connected input buffers. Also, for the purpose of buffering low-frequency clocks or data, a latching unit may be additionally provided in the buffer output signal terminal of the input buffer according to the invention.

As described above, the input buffer according to the invention has a greatly improved amplification factor and quick response characteristics. Also, even without an additional reference voltage generation circuit, the mid-value of a buffer output signal can be maintained at a stabilized level.

While this invention has been particularly shown and described with reference to the preferred embodiments thereof, it will be understood by those skilled in the art that various changes and equivalents may be made without departing from the spirit and scope of the invention. For example, it has been described throughout the specification that the first and the second capacitors C1 and C2 are included in the first and the second DC voltage controllers 22 and 24, respectively. However, the first and the second capacitors C1 and C2 may be externally connected, rather than being directly included in the input buffer, to implement the input buffer according to the invention. Therefore, the scope of the invention should be determined with reference to the appended claims.

What is claimed is:

1. An input buffer for amplifying a buffer input signal and generating a buffer output signal, comprising:
    a first direct-current (DC) voltage controller for generating a first alternating current (AC) signal having AC voltage components of the buffer input signal reflected thereon;
    a second DC voltage controller for generating a second AC signal having AC voltage components of the buffer input signal reflected thereon;
    a first driver for providing the buffer output signal the voltage level of which is driven to a first level in response to the first AC signal; and
    a second driver for providing the buffer output signal at a voltage that is driven to a second level in response to the first AC signal,
    wherein the first DC voltage controller includes
        a first control transistor formed between the first AC signal and a power supply voltage and gated by the first AC signal, and
        a first current source formed, between the first AC signal and a ground voltage, for controlling the amount of current through the first control transistor; and
    wherein the second DC voltage controller includes
        a second control transistor formed between the second AC signal and a ground voltage and gated by the second AC signal, and
        a second current source, formed between the second AC signal and the power supply voltage, for controlling the amount of current through the second control transistor.

2. The input buffer according to claim 1, wherein the first DC voltage controller further includes a first capacitor formed between the buffer input signal and the first AC signal, and wherein the second DC voltage controller further includes a second capacitor formed between the buffer input signal and the second AC signal.

3. The input buffer according to claim 2, further comprising a bias unit for generating first and second bias signals for controlling the first and the second current sources, wherein the first and the second current sources are first NMOS and first PMOS transistors controlled by the first and second bias signals, respectively.

4. The input buffer according to claim 3, wherein the bias unit comprises:

a first bias part for generating the first bias signal; and a second bias part, controlled by the first bias signal, for generating the second bias signal.

5. The input buffer according to claim 4, wherein the first bias part comprises:

a resistance formed between the first voltage and the first bias signal; and a second NMOS transistor having a gate terminal and a drain terminal commonly connected to the first bias signal and a source terminal connected to the second voltage.

6. The input buffer according to claim 4, wherein the second bias part comprises:

a third NMOS transistor having a gate terminal gated by the first bias signal, a source terminal connected to the second voltage and a drain terminal connected to the second bias signal; and a second PMOS transistor having a gate terminal and a drain terminal commonly connected to the second bias signal and a source terminal connected to the first voltage.

7. The input buffer according to claim 1, further comprising a bias unit for generating first and second bias signals for controlling the first and the second current sources, wherein the first and the second current sources are first NMOS and first PMOS transistors controlled by the first and the second bias signals, respectively.

8. The input buffer according to claim 7, wherein the bias unit comprises:

a first bias part for generating the first bias signal; and a second bias part, controlled by the first bias signal, for generating the second bias signal.

9. The input buffer according to claim 8, wherein the first bias part comprises:

a resistance formed between the first voltage and the first bias signal; and a second NMOS transistor having a gate terminal and a drain terminal commonly connected to the first bias signal and a source terminal connected to the second voltage.

10. The input buffer according to claim 8, wherein the second bias part comprises:

a third NMOS transistor having a gate terminal gated by the first bias signal, a source terminal connected to the second voltage and a drain terminal connected to the second bias signal; and a second PMOS transistor having a gate terminal and a drain terminal commonly connected to the second bias signal and a source terminal connected to the first voltage.

11. The input buffer according to claim 1, wherein the first voltage is a power supply voltage and the second voltage is a ground voltage.

12. The input buffer according to claim 11, wherein the first driver includes a PMOS transistor, gated by the first AC signal, for driving the voltage level of the buffer output signal to the power supply voltage, and the second driver includes an NMOS transistor, gated by the second AC signal, for driving the voltage level of the buffer output signal to the ground voltage.

* * * * *